(12) United States Patent
Roux et al.

(10) Patent No.: US 7,751,130 B2
(45) Date of Patent: Jul. 6, 2010

(54) OPTICAL ELEMENT DAMPING SYSTEMS

(75) Inventors: Stephen Roux, New Fairfield, CT (US); Peter Kochersperger, Easton, CT (US); Justin Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 249 days.

(21) Appl. No.: 11/634,931

(22) Filed: Dec. 7, 2006

(65) Prior Publication Data

US 2007/0153348 A1     Jul. 5, 2007

Related U.S. Application Data

(60) Provisional application No. 60/754,898, filed on Dec. 30, 2005.

(51) Int. Cl.
*G02B 7/02* (2006.01)
(52) U.S. Cl. ........................ 359/811; 359/819
(58) Field of Classification Search ......... 359/811–823; 355/53, 72, 77; 310/12
See application file for complete search history.

(56) References Cited

U.S. PATENT DOCUMENTS

| | | | | |
|---|---|---|---|---|
| 5,229,872 A | 7/1993 | Mumola | ......... | 349/2 |
| 5,296,891 A | 3/1994 | Vogt et al. | ......... | 355/67 |
| 5,523,193 A | 6/1996 | Nelson | ......... | 430/311 |
| 5,684,639 A * | 11/1997 | Ohtake | ......... | 359/693 |
| 6,906,786 B2 * | 6/2005 | Cox et al. | ......... | 355/53 |
| 7,349,069 B2 * | 3/2008 | Beems et al. | ......... | 355/53 |

FOREIGN PATENT DOCUMENTS

| | | |
|---|---|---|
| WO | WO 98/33096 | 7/1998 |
| WO | WO 98/38597 A2 | 9/1998 |
| WO | WO 98/38597 A3 | 9/1998 |

* cited by examiner

*Primary Examiner*—Mohammed Hasan
(74) *Attorney, Agent, or Firm*—Sterne, Kessler, Goldstein & Fox P.L.L.C.

(57) ABSTRACT

The present invention is directed to optical element damping systems. In particular, an eddy current damper is disclosed. The eddy current damper includes a rod, a series of conducting plates coupled to the rod, and layers of magnets. The alternating layers have alternating magnetic fields. When an optical element moves, the optical element will exert a force on the rod. The rod causes the conducting plates to move relative to the alternating layers of magnets to generate eddy currents within each of the conducting plates, such that the eddy currents damp the motion of an optical element. In an alternative embodiment, an eddy current damper motion amplifier is used to provide additional mechanical advantage that significantly increases the damping provided by the eddy current damper. Eddy current dampers are provided within conventional scanning lithography devices and optical maskless lithography devices to improve performance by stabilizing optical element motion.

25 Claims, 8 Drawing Sheets

OPTICAL ELEMENT DAMPING SYSTEMS

CROSS REFERENCES TO RELATED APPLICATIONS

This application claims the benefit of priority to U.S. Provisional Patent Application, Application No. 60/754,898, filed Dec. 30, 2005, which is incorporated herein by reference in its entirety.

BACKGROUND OF THE INVENTION

1. Field of the Invention

The present invention relates to lithography, and more particularly, to optical element damping systems.

2. Background of Invention

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and/or grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles is required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a spatial light modulator (SLM) (e.g., a digital micromirror device (DMD), a liquid crystal display (LCD), or the like). The SLM includes an array of active areas (e.g., mirrors or transmissive areas) that are either ON or OFF to form a desired pattern. A predetermined and previously stored algorithm based on a desired exposure pattern is used to turn ON and OFF the active areas.

Conventional SLM-based writing systems (e.g., Micronic's Sigma 7000 series tools) use one SLM as the pattern generator. To achieve linewidth and line placement specifications, gray scaling is used. For analog SLMs, gray scaling is achieved by controlling mirror tilt angle (e.g., Micronic SLM) or polarization angle (e.g., LCD). For digital SLMs (e.g., TI DMD), gray scaling is achieved by numerous passes or pulses, where for each pass or pulse the pixel can be switched either ON or OFF depending on the level of gray desired. Because of the total area on the substrate to be printed, the spacing between active areas, the timing of light pulses, and the movement of the substrate, several passes of the substrate are required to expose all desired areas. This results in low throughput (number of pixels packed into an individual optical field/number of repeat passes required over the substrate) and increased time to fabricate devices. Furthermore, using only one SLM requires more pulses of light or more exposure time to increase gray scale. This can lead to unacceptably low levels of throughput.

Maskless lithography systems require utilizing a minimum number of pulses to achieve dose in order to meet reasonable throughputs. Hence, it is not possible to take advantage of 50 pulse averages as in conventional lithography systems to achieve acceptable laser pulse-to-pulse variations. Conventional lithography systems use 30-50 pulses to write each feature. Typically, in maskless lithography 2-4 pulses are used to write each feature for reasonable throughput. There is a reduction in the ability to average pulses, which requires that lens cells within lithographic tools do not distort imaging.

Lens cells for lithographic tools are designed to be connected to the rest of the projection lens or projection lens body with stiff, yet thermally relieved connections. The connection must be stiff in order to minimize relative motion of the lens to the body to maintain extremely critical alignment. The same connections must be thermally relieved (kinematic) so that the element is not over constrained, which would cause distortion of the ultra high precision lens as even minute temperature changes occur. The lens shape must be preserved at nanometer level in spite of the rigid connection.

Lens mounts are made out of metal flexure blades or metal spring arrays, which allow rigid connection without optical distortion, as will be known by individuals skilled in the relevant arts. Inherently, these mounts have extremely small amounts of damping in them. The result is that a lens may experience large (at nanometer scale) amplitude motion if excited at the resonance of the mount.

In current scanning lithography system these high frequency vibrations are smeared out by the scan averaging of the system, as explained above, and do not result in measurable printing errors at the wafer. Conversely, steppers and machines operating with extremely small amounts of scan averaging, such as optical maskless lithography systems, will experience pattern placement errors due to the high frequency vibration of some of the optical elements.

The placement error amount depends on the sensitivity of each of the optical elements to vibration. Optical designs constrained to having little or no sensitivity to motion of any of the optical elements relative to each other are not practical. On the other hand, optical designs with large amounts of damping in the lens mounts are not stable due to hysteresis. Aligned elements do not spring back to the optimal aligned position after a transient disturbance, such as, shipping vibrations, if there is any substantial amount of damping in the system.

What are needed are optical systems and lens mounts that provide a balance between being over-constrained and having too much damping.

SUMMARY OF THE INVENTION

The present invention is directed to optical element damping systems. In particular, an eddy current damper is disclosed. The eddy current damper includes a rod, a series of conducting plates coupled to the rod, and alternating layers of magnets. The alternating layers have alternating magnetic fields. When an optical element moves, the optical element will exert a force on the rod. The rod causes the conducting plates to move relative to the alternating layers of magnets to generate eddy currents within each of the conducting plates, such that the eddy currents damp the motion of an optical element. In an alternative embodiment, a motion amplifier is used to provide additional mechanical advantage that significantly increases the damping provided by the eddy current damper for a given damper volume.

In further aspects of the invention, optical element assemblies are disclosed that include one or more eddy current dampers coupled to optical elements and optical element mounts.

In still further aspects of the invention, eddy current dampers are provided within conventional scanning lithography devices and optical maskless lithography devices to improve performance by stabilizing optical element motion.

The present invention provides numerous benefits. First the present invention improves overlay performance for optical maskless lithography systems. Second, the present invention reduces image smearing performance for conventional lithographic scanner systems. Third, improved overlay performance for traditional lithographic stepper systems is achieved. In general, the present invention tolerates acoustic and base vibration in lithographic systems, while avoiding over constraining the lens optical and opto-mechanical designs.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1:
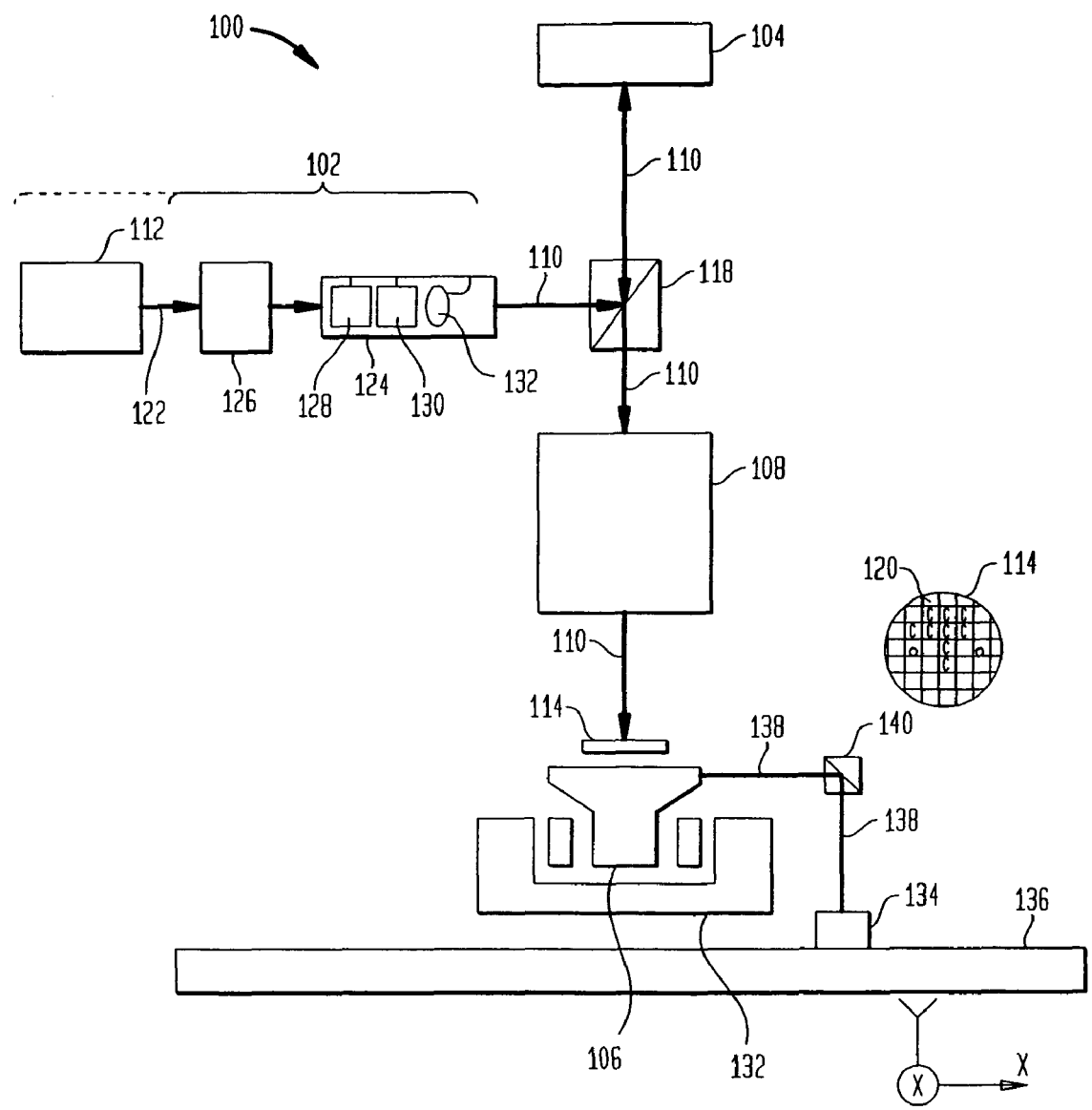
FIG. 1 is a diagram of a lithographic projection apparatus, according to an embodiment of the invention.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Although specific reference may be made in this text to the use of lithographic apparatus in the manufacture of integrated circuits (ICs), it should be understood that the lithographic apparatus and projection systems described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" and "light ray" used herein encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 5-20 nm), as well as particle beams, such as ion beams or electron beams.

The illumination system may also encompass various types of optical components, including refractive, reflective, and catadioptric optical components for directing, shaping, or controlling the projection beam of radiation.

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 is a diagram of lithographic projection apparatus 100, according to an embodiment of the invention. Apparatus 100 includes at least a radiation system 102, pattern generator 104, an object table 106 (e.g., a substrate table), and an projection system 108. Optical damping systems, such as eddy current damper 200, which is described below, can be used to provide increased stability to the optical elements within the lithographic projection apparatus 100. Eddy current dampers can be used with all or some of the optical elements within apparatus 100, depending on the criticality of the particular optical element. Additionally, one or more eddy current dampers can be associated with a particular optical element depending on the criticality of the particularly optical element, space constraints and other design factors.

Radiation system 102 can be used for supplying a projection beam 110 of radiation (e.g., UV radiation), which in this particular case also comprises a radiation source 112.

A pattern generator 104 (e.g., spatial light modulator) can be used for applying a pattern to projection beam 110. The term "pattern generator" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the pattern generator can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the pattern generator may differ substantially from the pattern eventually transferred to a layer of or on the substrate. Similarly, the pattern eventually generated on the substrate may not correspond to the pattern formed at any one instant on the pattern generator. This may be the case in an arrangement in which the eventual pattern formed on each part of the substrate is built up over a given period of time or a given number of exposures during which the pattern on the pattern generator and/or the relative position of the substrate changes.

In general, the position of pattern generator 104 can be fixed relative to projection system 108. However, in an alternative arrangement, pattern generator 104 may be connected to a positioning device (not shown) for accurately positioning it with respect to projection system 108. As here depicted, pattern generator 104 is of a reflective type (e.g., has a reflective array of individually controllable elements).

Object table 106 can be provided with a substrate holder (not specifically shown) for holding a substrate 114 (e.g., a resist coated silicon wafer or glass substrate) and object table 106 can be connected to a positioning device (not shown) for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of pattern generator 104 onto substrate 114. Alternatively, projection system 108 may project images of secondary sources for which the elements of pattern generator 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on pattern generator 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts pattern generator 104 after being directed using beam splitter 118. Having been reflected by pattern generator 104, beam 110 passes through projection system 108, which focuses beam 110 onto a target portion 120 of the substrate 114.

With the aid of positioning device (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the pattern generator 104 can be used to accurately correct the position of pattern generator 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position pattern generator 104. It will be appreciated that projection beam 110 may alternatively/additionally be moveable, while object table 106 and/or pattern generator 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern from pattern generator 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, pattern generator 104 is movable in a given direction (the so-called "scan direction", e.g., the y direction) with a speed v, so that patterned projection beam 110 is caused to scan over pattern generator 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on pattern generator 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on pattern generator 104 is updated as patterned projection beam 110 scans across substrate 114 and exposes it.

Combinations and/or variations on the above described modes of use or entirely different modes of use may also be employed. Additionally, as will be known by individuals skilled in the relevant arts, based on the teachings herein, the present invention can be employed within a variety of conventional and maskless lithography systems beyond the examples described above. Additionally, the present invention can be employed in other optical designs that require stable optical elements that are not overly constrained.

Optical element mounts used to secure optical elements within lithography tools are typically made of metal flexure blades or metal spring arrays, which allow rigid connection without optical distortion, as will be known by individuals skilled in the relevant arts. Inherently, these mounts have extremely small amounts of damping in them. The result is that an optical element may experience large (at nanometer scale) amplitude motion if excited at the resonance of the mount.

In current scanning lithography system these high frequency vibrations are smeared out by the scan averaging of the system, as explained above, and do not result in measurable printing errors at the wafer. On the other hand, steppers and machines operating with extremely small amounts of scan averaging, such as optical maskless lithography systems, will experience pattern placement errors due to the high frequency vibration of some of the optical elements.

The placement error amount depends on the sensitivity of each of the optical elements to vibration. Optical designs constrained to having little or no sensitivity to motion of any of the optical elements relative to each other are not practical. On the other hand, optical designs with large amounts of damping in the lens mounts are not stable due to hysteresis. Aligned elements do not spring back to the optimal aligned position after a transient disturbance, such as, shipping vibrations, if there is any substantial amount of damping in the system.

Eddy Current Damper

The present invention provides viscous damping, which means that no work is done unless there is motion. The present invention provides an eddy current damper to achieve the level of damping required without overconstraining the system. The device is passive, which is desirable from a cost and complexity standpoint. Additionally, the device is tunable in that the parameters can be varied to achieve a variety of damping ratios, relative to critical damping, to match the performance requirements.

The eddy current damper includes a permanent magnetic field attached to the lens body and a conductor attached to the lens cell that interacts with the magnetic field. Relative motion of the field to the conductor generates potential in the conductor, resulting in current flow. The heat lost due to current flow results in tiny irreversible loss of energy in the system, which results in sub-critical vibration damping. Kinetic energy is transformed into heat. Without damping the kinetic energy would be transferred into potential energy stored in the elastic mount hardware, which would later be converted back into kinetic energy in an unending oscillating loop.

Typical viscous dampers using a fluid and an orifice are not known to be effective at the extremely small amplitudes being suppressed. Such a damper may or may not be viable, depending on whether any irreversible shearing of the fluid would occur at the small amplitudes. Some elastic behavior of the fluid can be expected at very small displacements, resulting in no damping. The magnetic solution using an eddy current damper, as disclosed herein, is preferred due to its known lack of hysteresis and expected linear behavior at small amplitudes.

Figure 2A:
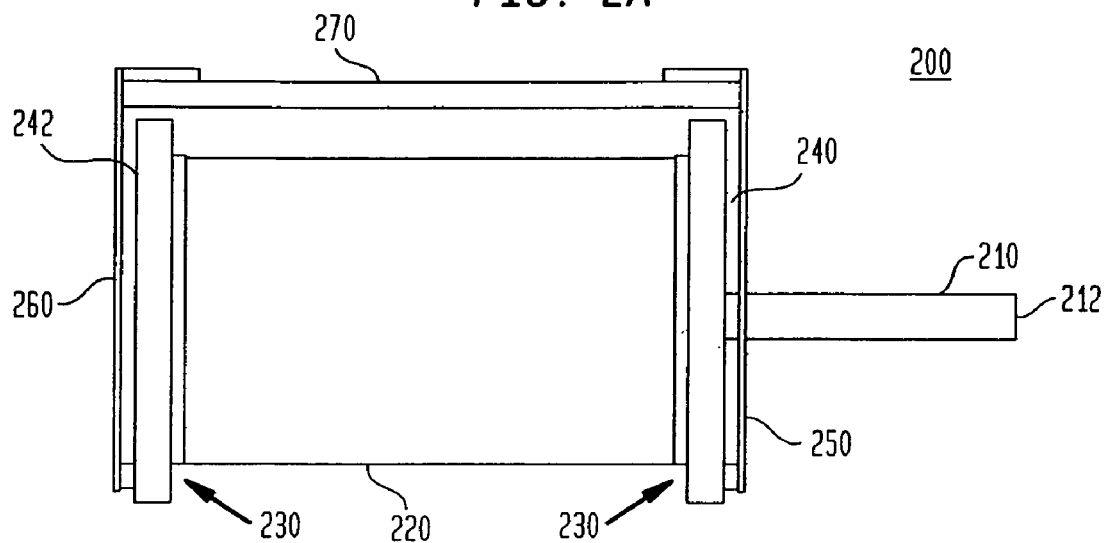
FIG. 2A is a diagram of a side view of an eddy current damper, according to an embodiment of the invention.

FIG. 2A is a diagram of a side view of eddy current damper 200, according to an embodiment of the invention. Eddy current damper 200 includes rod 210, alternating layers of magnets 220, a series of conducting plates 230, front end plate 240, rear end plate 242, and a housing that includes front damper flexure 250, rear damper flexure 260, and top plate 270. Within FIG. 2A, the side panels of the housing have been removed to expose the internal elements of the eddy current damper. The side panels of the housing are shown in FIG. 2B.

Figure 2B:
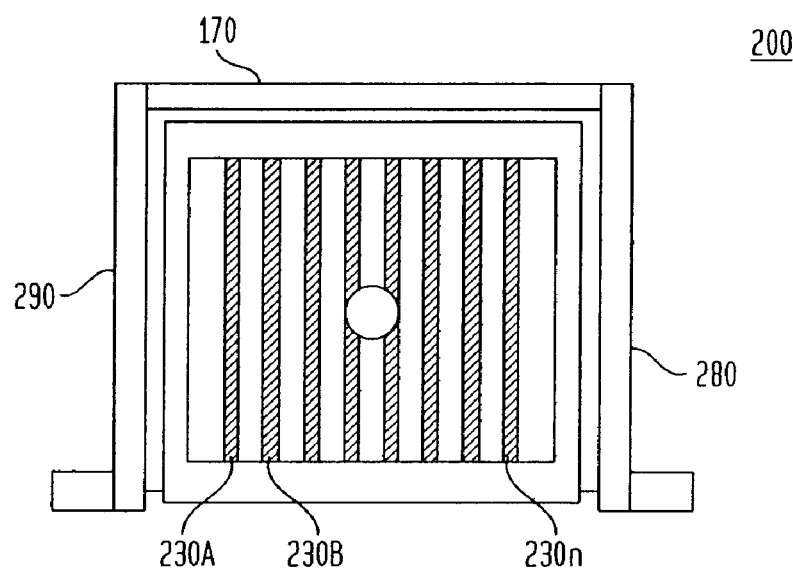
FIG. 2B is a diagram of a front view of an eddy current damper, according to an embodiment of the invention.

FIG. 2B is a diagram of a front view of eddy current damper 200 that shows each of the metal plates within the series of conducting plates 230. The plates are identified at conducting plates 230A, 230B . . . 230n. Additionally, FIG. 2B illustrates the side panels of the housing that were removed in FIG. 2A. The housing includes side panels 280 and 290. These side panels include feet to affix the eddy current damper to a lithographic tool or other device. Note that within FIG. 2B, front end plate 240 is not shown, so that alternating layers of magnets 220 and series of metal plates 230 can be seen.

Figure 3:
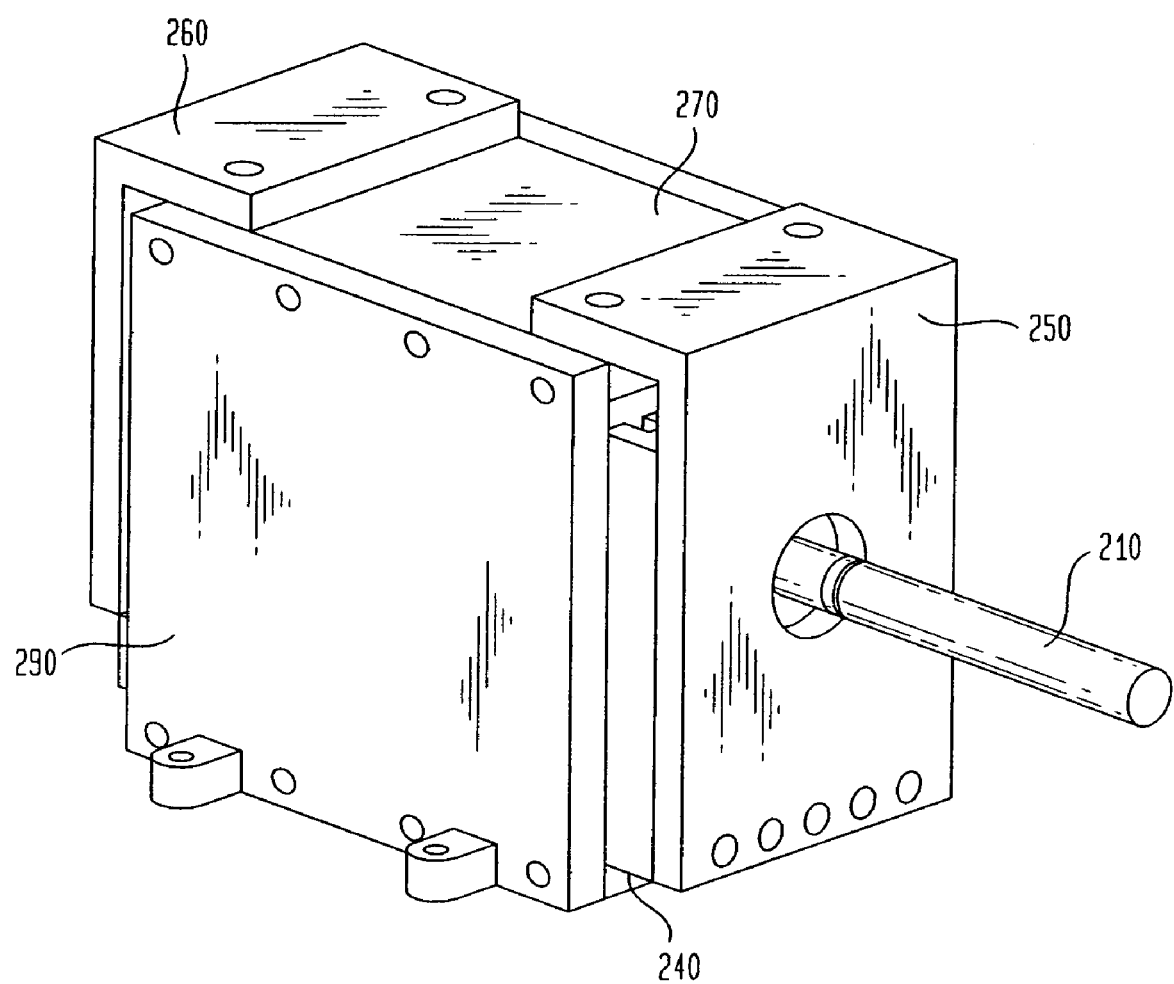
FIG. 3 is a diagram of a perspective view of an eddy current damper, according to an embodiment of the invention.
Figure 4:
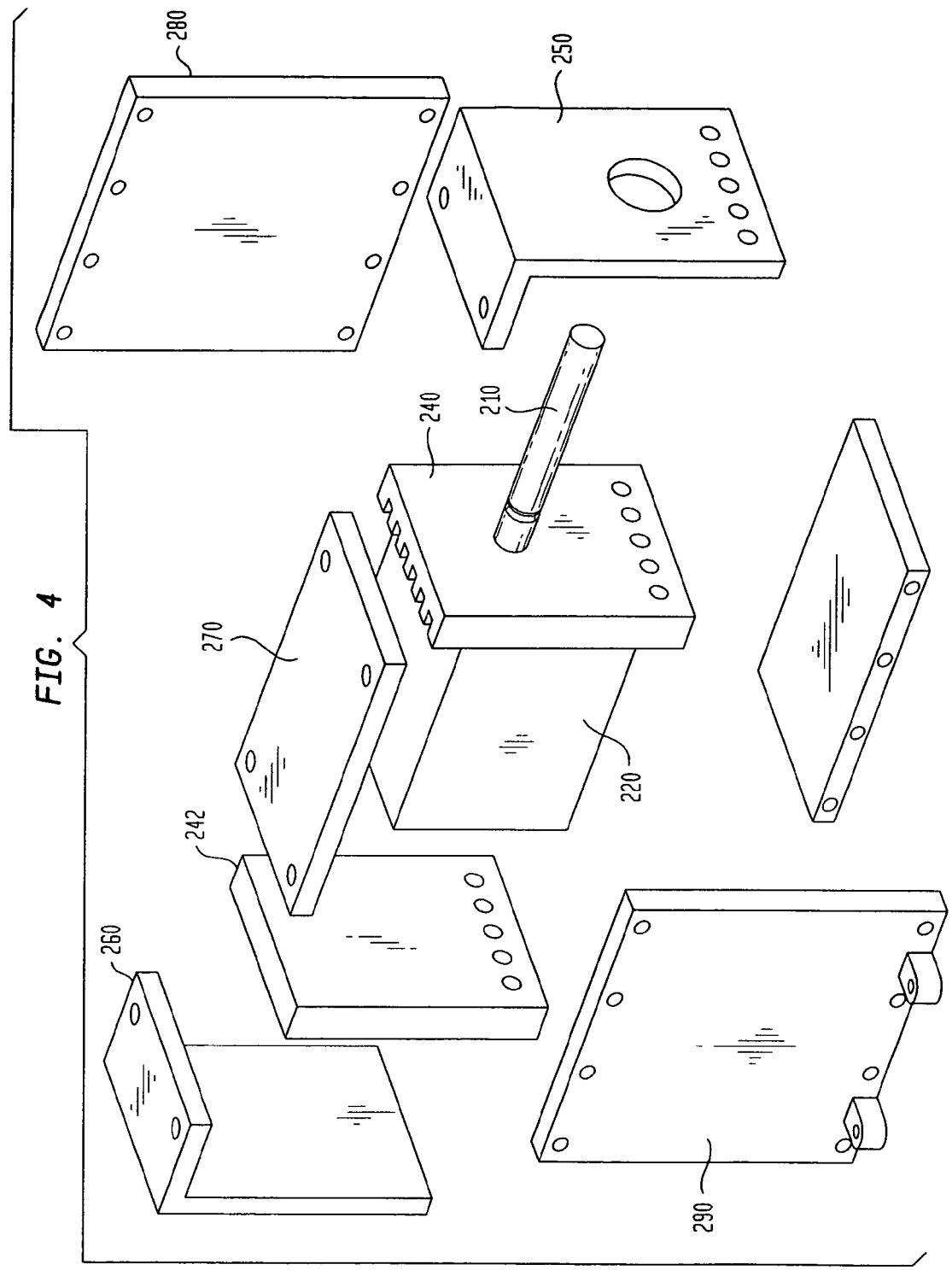
FIG. 4 is a diagram of a disassembled perspective view of an eddy current damper, according to an embodiment of the invention.

FIG. 3 provides a perspective diagram of eddy current damper 200 that shows eddy current damper 200 without any portion removed. Similarly, FIG. 4 provides a disassembled perspective diagram of eddy current damper 200 to further illustrates the assembly of one embodiment of the invention.

Referring back to FIG. 2A, rod 210 pushes against an optical element when an optical element moves in a direction parallel to the axis of rod 210. Rod end 212 will be positioned close to an optical element that is to be stabilized, such that when the optical element vibrates it will push against rod end 212.

The series of conducting plates 230 are coupled to rod 210. In particular, series of conducting plates 230 and rod 210 are affixed to front end plate 240. Conducting plates 230 can be made of copper, silver or other conducting material as will be known by individuals skilled in the relevant arts. When an optical element moves in the axial direction of rod 210, this movement causes the rod to move the series of conducting plates 230 back and forth relative to alternating layers of magnets 220. Note that in an alternative embodiment, the series of conducting plates 230 can be fixed, while the layers of magnets 220 can be coupled to rod 210 and move when rod 210 exerts a force on the layers of magnets 220.

Figure 2C:
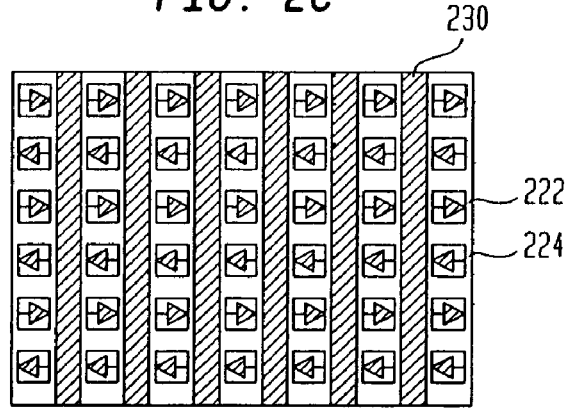
FIG. 2C is a diagram showing the relationship between conducting plates and alternating magnets within an eddy current damper, according to an embodiment of the invention.

Alternating layers of magnets 220 are positioned such that when the series of metal plates 230 are moved back and forth across the layers of magnets 220, eddy currents are formed within each of the conducting plates within the series of conducting plates 230. FIG. 2C provides a diagram to illustrate the relationship between the conducting plates 230 and the alternating magnets 220.

Figure 2D:
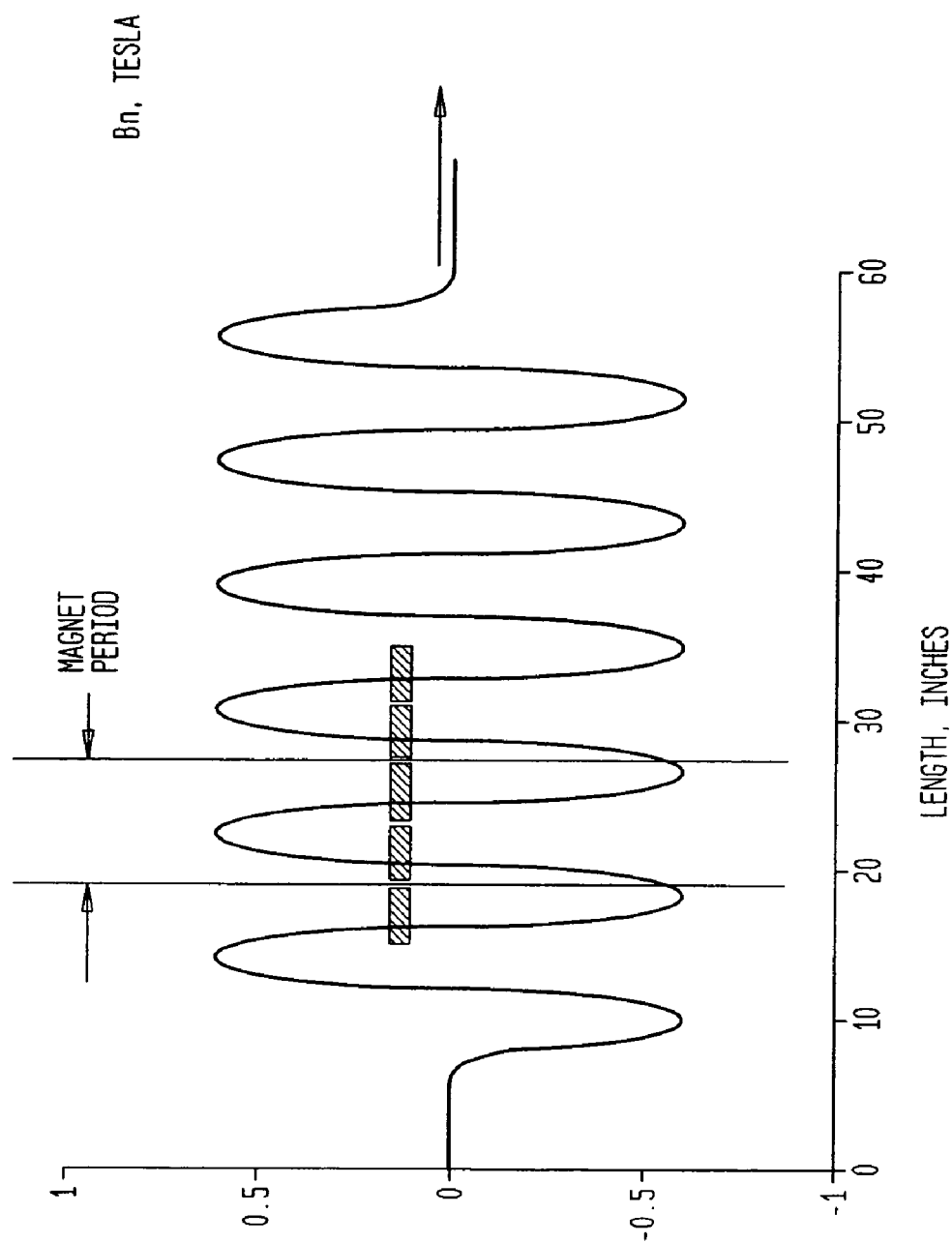
FIG. 2D is a plot showing the magnetic field relationship to the conducting plates within an eddy current damper, according to an embodiment of the invention.

In FIG. 2C, conducting plates 230 would move in and out of the page, while each row of magnets has a magnetic field going in the opposite direction of the field in the row adjacent to it. For example, row of magnets 222 has a magnetic field that goes from left to right, while row of magnets 224 has a magnetic field that goes from right to left. The arrangement of conducting plates to alternating magnets will create a magnetic field relationship to the conducting plates as shown in FIG. 2D. Within FIG. 2D, five conducting plates 230 are shown against the profile of the magnetic field. Alternating layers of magnets 220 can be formed with permanent magnets or electromagnets.

In general, eddy currents are currents that exist as a result of voltages induced in the body of a conducting mass by a variation of magnetic flux. The variation of magnetic flux is the result of a varying magnetic field or of a relative motion of the mass with respect to the magnetic field. In the present case, relative motion of the series of conducting plates 230 to the magnetic field created by layers of magnets 220 generates potential in each of the conducting plates within the series of conducting plates 230, resulting in eddy current flow. The heat lost due to the eddy current flow results in tiny irreversible loss of energy in the system, which results in sub-critical vibration damping. The eddy currents have a damping effect on the motion of the optical element, thereby stabilizing the optical element and improving performance.

In an embodiment, an objective is to add damping equal to 2% of critical damping to a system. To achieve this goal for a typical optical maskless lithography lens element, the eddy current damper includes an array of copper plates that take up an area of 48 by 58 mm and the alternating layers of magnets generate a magnetic field equal to 0.6 T. The length of each copper plate is approximately 49 mm long. The overall optical element assembly—including the lens, mount and damper would weigh about 6 Kg, with about 1 Kg in copper. Thus, an eddy current damper to damp one degree of freedom for a typical OML lens element is about 60×60×50 mm in size. Approximately, 750 Nsec/m of damping is achieved for a damper having this volume.

The eddy current damper housing includes front damper flexure 250, rear damper flexure 260, top plate 270, side plate 280 and side plate 290. The eddy current damper housing houses rod 210, front end plate 240, rear end plate 242, series of conducting plates 230, and alternating layers of magnets 220. The eddy current damper housing includes a front damper flexure 250, which is affixed to the front end plate 240 and top plate 270 of the eddy current damper housing. Front damper flexure 250 is made of a flexible material that enables rod 210 to move laterally, such that the series of conducting plates 230 move relative to the alternating layers of magnets 220 when a force parallel to the axis of rod 210 is exerted on the rod. Rear damper flexure 260 is also made of a flexible material that enables rod 210 to move laterally, such that the series of conducting plates 230 move relative to the alternating layers of magnets 220 when a force parallel to the axis of rod 210 is exerted on the rod.

Figure 5A:
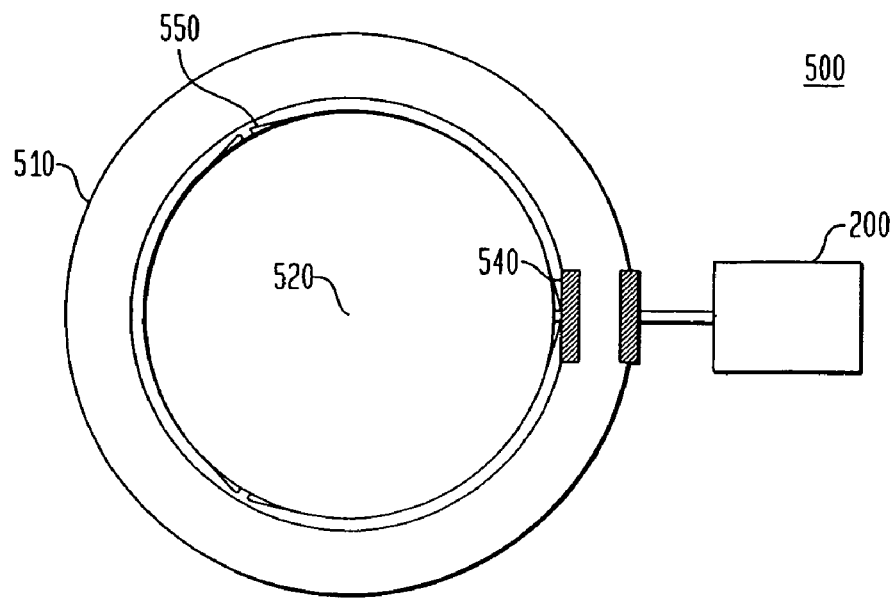
FIG. 5A is a diagram of an optical element assembly, according to an embodiment of the invention.

FIG. 5A is a diagram of an optical element assembly 500, according to an embodiment of the invention. Optical element assembly 500 includes optical element mount 510, an optical element 520, eddy current damper 200, eddy current damper attachment 540, and a set of optical element flexures 550. Optical element mount 510 secures an optical element into place, as will be known by individuals skilled in the relevant arts.

Optical element 520 can include a refractive, reflective, or catadioptric optical component for directing, shaping, or controlling a beam of radiation. For example, optical element 520 can include a lens or a mirror. Optical element mount 510 secures optical element 520 into place through the set of optical element flexures 550. Optical element flexures 550 are typically metal flexures that secure an optical element in place, as will be known by individuals skilled in the relevant arts. Eddy current damper attachment 540 couples eddy current damper 200 to optical element 520 and optical element mount 510, such that when optical element 520 moves in a direction having a force that is parallel to the axis of the rod of eddy current damper 200 that the rod will move, as explained above.

Figure 5B:
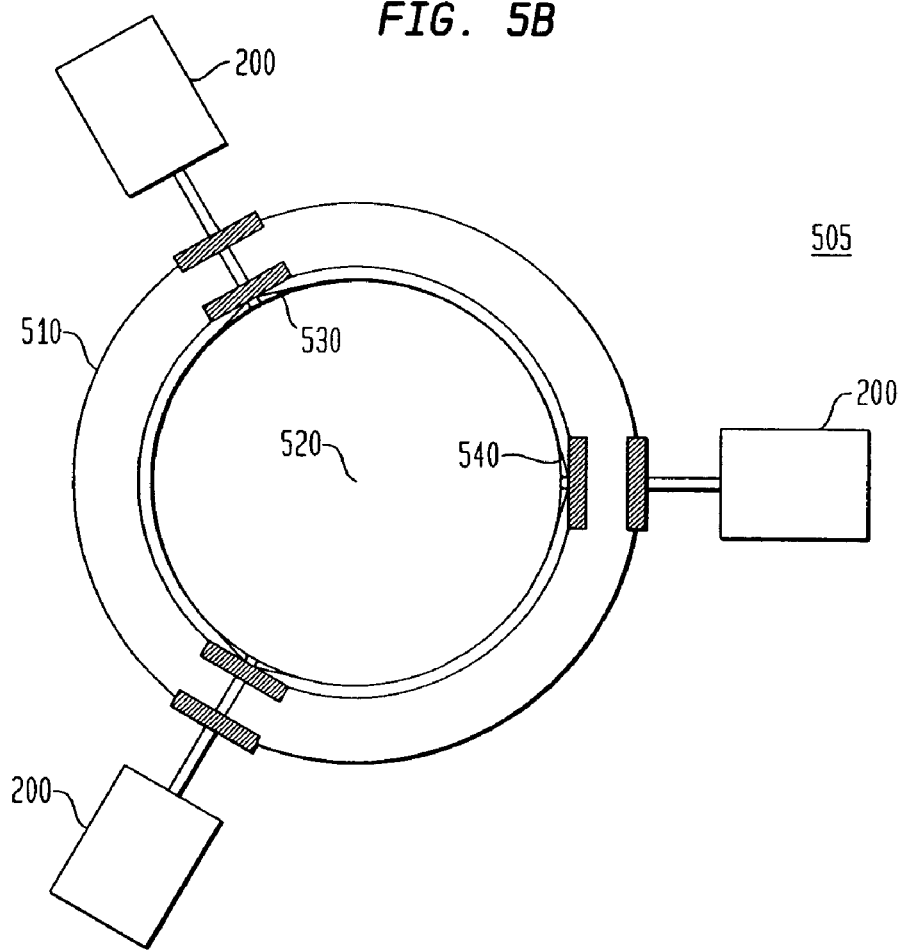
FIG. 5B is a diagram of an optical element assembly, according to an embodiment of the invention.

FIG. 5B provides a diagram of an optical element assembly 505, according to an embodiment of the invention. Optical element assembly 505 includes three eddy current dampers 200 that are positioned around the optical element mount 510. The use of multiple eddy current dampers provides additional stability for the optical element, as vibrations in multiple directions can be damped. In one embodiment, the eddy current dampers are equally spaced around the exterior of optical mount 510. Optical element assemblies 500 and 505 are illustrative to demonstrate the use of eddy current dampers, and are not intended to limit the scope of the invention. For example, optical element 520 can have other geometries other than circular, and any number of eddy current dampers can be used to provide damping for an optical element.

Figure 6:
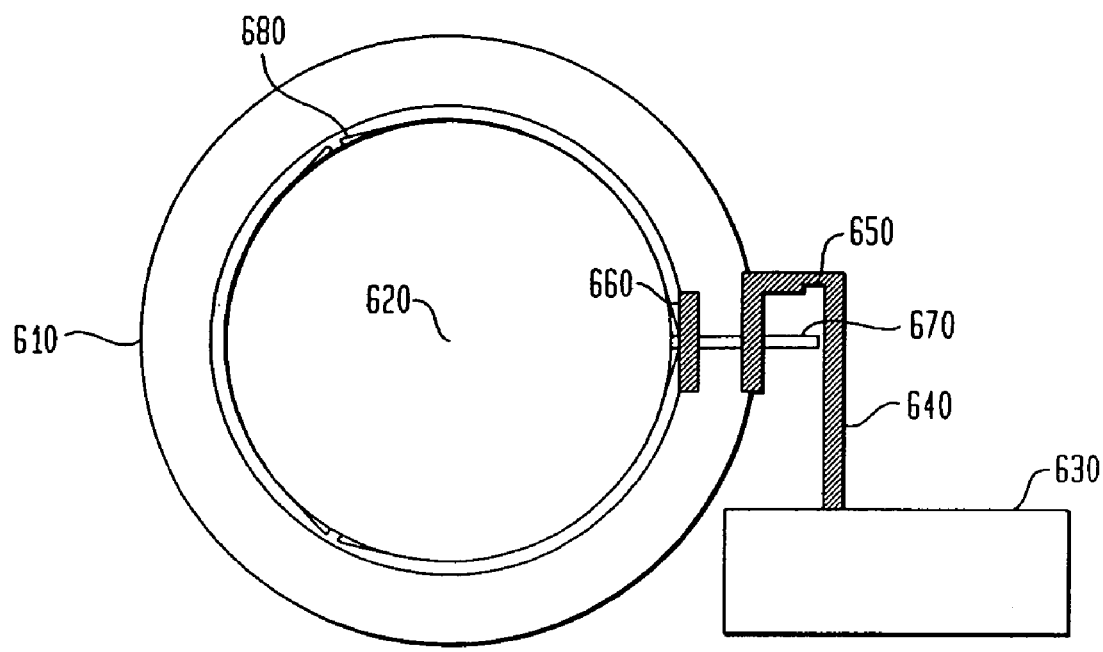
FIG. 6 provides a diagram of an optical element assembly, according to an embodiment of the invention.

FIG. 6 provides a diagram of an optical element assembly 600. Optical element assembly 600 is similar to optical element assembly 500, except that an alternative type of eddy current damper is employed. Optical element assembly 600 includes an optical element mount 610, an optical element 620, eddy current damper 630, eddy current damper attachment 660, and a set of optical element flexures 680.

Optical element mount 610 secures an optical element into place, as will be known by individuals skilled in the relevant arts.

Optical element 620 can include a refractive, reflective, or catadioptric optical component for directing, shaping, or controlling a beam of radiation. For example, optical element 620 can include a lens or a mirror. Optical element mount 610 secures optical element 620 into place through the set of optical element flexures 680. Optical element flexures 680 are typically metal flexures that secure an optical element in place, as will be known by individuals skilled in the relevant arts.

Eddy current damper attachment 660 couples rod 670 to optical element 620, such that when optical element 620 moves in a direction having a force that is parallel to the axis of rod 670, rod 670 exerts a force upon damper motion amplifier 640. Damper motion amplifier 640 is affixed to eddy current damper attachment 660 by extension 650. Extension 650 includes a portion that is tapered or narrowed relative to the rest of extension 650, such that the tapered or narrowed portion acts like a hinge, which allows damper motion amplifier 640 to move when rod 670 exerts a force on it.

Figure 7:
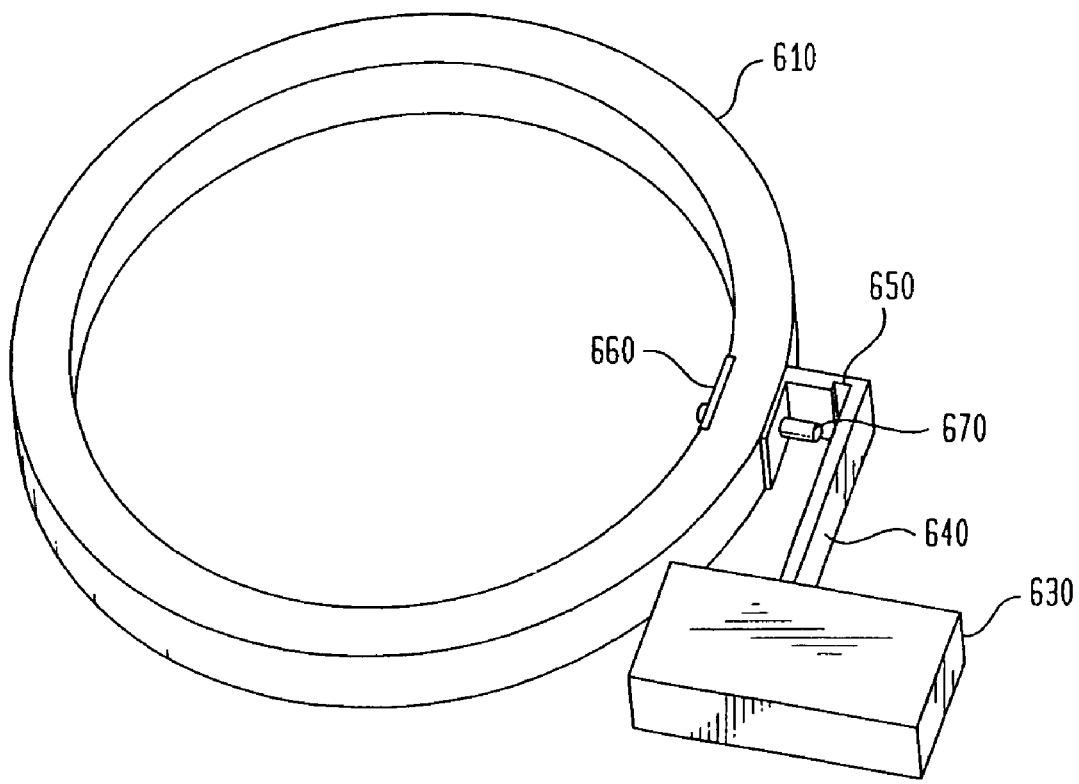
FIG. 7 provides a diagram of a perspective view of an optical element assembly, according to an embodiment of the invention.
Figure 8:
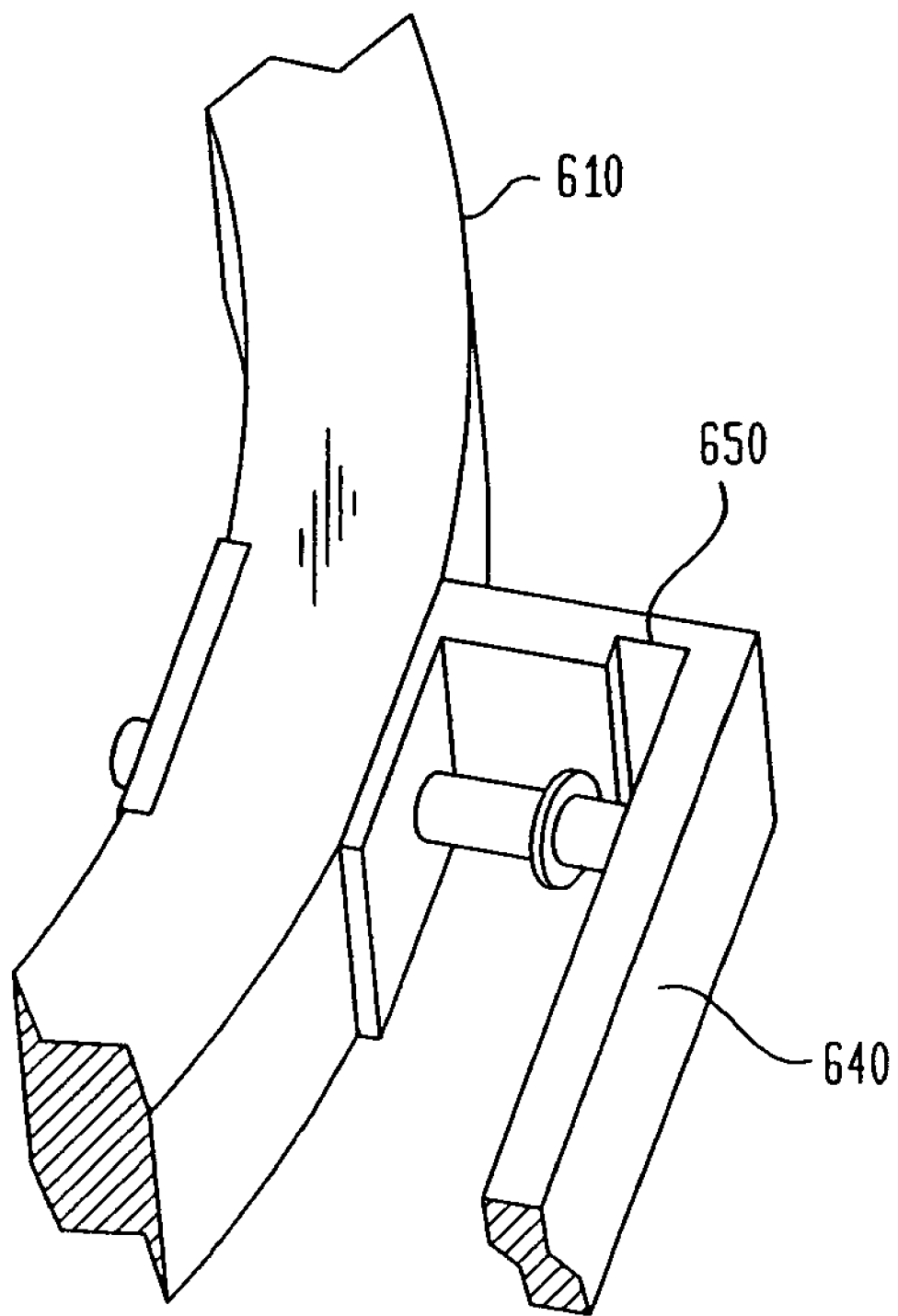
FIG. 8 provides a diagram of a perspective view of an optical element assembly, according to an embodiment of the invention.

Damper motion amplifier 640 is affixed to a series of conducting plates within eddy current damper 630 that will move relative to layers of alternating magnets to generate eddy currents. The eddy currents in turn damp the motion of optical element 620, as was discussed with respect to eddy current damper 200. The use of damper motion amplifier 640 provides a mechanical advantage, in effect acting like a lever, that increases damping relative to the damping generated by eddy current damper 200 in FIG. 2A. FIGS. 7 and 8 provide perspective views of optical element assembly 600 that illustrate the coupling of the optical element, optical element mount and eddy current damper.

Bellows Based Viscous Damper

In another embodiment of the present invention, a bellows attached to a lens mount in a manner that would result in compression and expansion of the bellows when there is lens cell motion is used in conjunction with a restriction at the exhaust of the bellows in order to achieve viscous damping even at very low amplitudes. In place of the orifice a length of capillary tube may be substituted in order to shear the fluid enough to create damping. In embodiments, the fluids could be either gases or liquids.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. An optical element assembly, comprising:
   an optical element mount;
   an optical element secured by the optical element mount; and
   an eddy current damper, including a plurality of conducting plates coupled to the optical element mount and configured to reduce movement of the optical element.

2. The optical element assembly of claim 1, wherein the optical element comprises a refractive, reflective, or catadioptric optical component for directing, shaping, or controlling a beam of radiation.

3. The optical element assembly of claim 1, wherein the optical element comprises a lens or mirror.

4. The optical element assembly of claim 1, wherein the eddy current damper includes:
   a rod coupled to the plurality of conducting plates and configured to push against the optical element when the optical element moves in a direction generating a force parallel to an axis of the rod; and
   layers of magnets with magnetic fields that alternate from an individual layer to an adjacent layer, wherein the plurality of conducting plates move relative to the layers of magnets in response to the optical element exerting a force on the rod to generate eddy currents within the conducting plates, wherein the eddy currents dampen the motion of the optical element.

5. The optical element assembly of claim 4, wherein said eddy current damper further comprises a front end plate that affixes the rod to the plurality of conducting plates.

6. The optical element assembly of claim 4, wherein said eddy current damper further comprises an eddy current damper housing that houses the rod, the plurality of conducting plates, and the layers of magnets.

7. The optical element assembly of claim 6, wherein the eddy current damper housing includes a front damper flexure, wherein the front damper flexure is affixed to a front end plate and top portion of the eddy current damper housing.

8. The optical element assembly of claim 7, wherein the front damper flexure comprises a flexible material that enables the rod to move laterally, such that the plurality of conducting plates move relative to the layers of magnets when a force is exerted on the rod.

9. The optical element assembly of claim 4, wherein the layers of magnets comprise permanent magnets and/or electromagnets.

10. The optical element assembly of claim 1, wherein the plurality of conducting plates comprise copper.

11. The optical element assembly of claim 1, wherein said eddy current damper includes:
   a rod coupled to the optical element;
   a damper motion amplifier attached to the optical mount, wherein in response to the optical element moving in an axial direction of the rod, the rod is configured to exert a force on the damper motion amplifier; and wherein the damper motion amplifier is coupled to the plurality of conducting plates and is configured to stimulate movement of the plurality of conducting plates in response to the rod exerting a force on the damper motion amplifier; and
   layers of magnets with magnetic fields that alternate from an individual layer to an adjacent layer, wherein the plurality of conducting plates are configured to move relative to the layers of magnets in response to the optical element exerting a force on the rod to generate eddy currents within the plurality of conducting plates, wherein the eddy currents dampen the motion of the optical element.

12. The optical element assembly of claim 11, wherein said eddy current damper further comprises an eddy current housing that houses the plurality of conducting plates and the layers of magnets.

13. The optical element assembly of claim 11, wherein the layers of magnets comprise permanent magnets and/or electromagnets.

14. The optical element assembly of claim 1 further comprising a plurality of the eddy current dampers.

15. The optical element assembly of claim 14, wherein the optical element assembly is part of an optical maskless lithography system or a conventional lithographic scanner system.

16. An eddy current damper, comprising:
   a rod configured to push directly or indirectly against an optical element if an optical element moves in a direction generating a force parallel to an axis of the rod;
   a plurality of conducting plates coupled to the rod; and
   layers of magnets with magnetic fields that alternate from an individual layer to an adjacent layer, wherein the plurality of conducting plates move relative to the layers of magnets in response to the optical element exerting a force on the rod to generate eddy currents within the plurality of conducting plates, wherein the eddy currents dampen the motion of the optical element.

17. The eddy current damper of claim 16, further comprising a front end plate that affixes the rod to the plurality of conducting plates.

18. The eddy current damper of claim 16, further comprising an eddy current damper housing that houses the rod, the plurality of conducting plates, and the layers of magnets.

19. The eddy current damper of claim 16, wherein the eddy current damper housing includes a front damper flexure, wherein the front damper flexure is affixed to the front end plate and top portion of the eddy current damper housing.

20. The eddy current damper of claim 19, wherein the front damper flexure comprises a flexible material that enables the rod to move laterally, such that the plurality of conducting plates move relative to the layers of magnets when a force parallel to the axis of the rod is exerted on the rod.

21. The eddy current damper of claim 16, wherein the plurality of conducting plates comprise copper.

22. The eddy current damper of claim 16, wherein the layers of magnets comprise permanent magnets and/or electromagnets.

23. An eddy current damper, comprising:
   a rod coupled to an optical element;
   a damper motion amplifier attached to an optical element mount, wherein in response to the optical element moving in an axial direction of the rod, the rod is configured to exert a force on the damper motion amplifier;
   a plurality of conducting plates coupled to the damper motion amplifier, wherein the damper motion amplifier is configured to stimulate movement of the plurality of conducting plates in response to the rod exerting a force on the damper motion amplifier; and
   layers of magnets with magnetic fields that alternate from an individual layer to an adjacent layer, wherein the plurality of conducting plates are configured to move relative to the layers of magnets if the optical element exerts a force on the rod to generate eddy currents within the plurality of conducting plates, wherein the eddy currents dampen the motion of the optical element.

24. The eddy current damper of claim 23, wherein said plurality of conducting plates comprise copper.

25. The eddy current damper of claim 23, wherein the layers of magnets comprise permanent magnets and/or electromagnets.

* * * * *